US011651810B2

(12) United States Patent
Kim

(10) Patent No.: US 11,651,810 B2
(45) Date of Patent: May 16, 2023

(54) MEMORY SYSTEM AND MEMORY MODULE INCLUDING MEMORY CHIPS SHARING CHANNEL

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 67 days.

(21) Appl. No.: 17/527,628

(22) Filed: Nov. 16, 2021

(65) Prior Publication Data

US 2022/0189527 A1 Jun. 16, 2022

Related U.S. Application Data

(60) Provisional application No. 63/125,062, filed on Dec. 14, 2020.

(30) Foreign Application Priority Data

Oct. 12, 2021 (KR) ........................ 10-2021-0134743

(51) Int. Cl.
*G11C 11/40* (2006.01)
*G11C 11/406* (2006.01)
*G06F 3/06* (2006.01)

(52) U.S. Cl.
CPC .......... *G11C 11/406* (2013.01); *G06F 3/0623* (2013.01); *G06F 3/0655* (2013.01); *G06F 3/0679* (2013.01)

(58) Field of Classification Search
None
See application file for complete search history.

(56) References Cited

U.S. PATENT DOCUMENTS

| | | | | |
|---|---|---|---|---|
| 10,504,577 | B1 * | 12/2019 | Alzheimer | G11C 11/4094 |
| 2007/0070764 | A1 * | 3/2007 | Miyamoto | G11C 11/22 365/222 |
| 2015/0109871 | A1 * | 4/2015 | Bains | G11C 11/40611 365/222 |
| 2017/0201503 | A1 * | 7/2017 | Jayasena | G06F 21/85 |
| 2020/0202921 | A1 * | 6/2020 | Morohashi | G11C 11/40622 |
| 2021/0005240 | A1 * | 1/2021 | Brown | G11C 11/406 |

FOREIGN PATENT DOCUMENTS

KR 10-2015-0100184 A 9/2015

* cited by examiner

*Primary Examiner* — Tracy C Chan
(74) *Attorney, Agent, or Firm* — IP & T Group LLP

(57) ABSTRACT

A memory system includes: a plurality of memory chips each including a plurality of banks and each suitable for generating a tracking address by tracking a row-hammer risk of selected banks among the banks, encrypting the tracking address using an encryption key to output tracking information to a corresponding data bus of a plurality of data buses and performing a target refresh operation according to a row-hammer address transferred through a command/address bus; and a memory controller suitable for collecting the tracking information for the banks transferred through the plurality of data buses to generate and output the row-hammer address to the command/address bus.

23 Claims, 10 Drawing Sheets

START
S1010 Receive row-hammer command from memory controller
S1020 Latch row-hammer address according to row-hammer command
S1030 Decrypt row-hammer address using KEY to output target address
S1040 Perform target refresh operation according to target address
END 100
150
110
MEMORY
151
152
153
154
155
156
157
158
DATA0
DATA1
DATA2
DATA3
DATA4
DATA5
DATA6
DATA7
C/A, CK
MEMORY I/F
119
120
HOST I/F
111
PROCESSOR
113
CMD/ADD GENERATION MODULE
115
REFRESH ANALYSIS MODULE
117
REQ
HOST

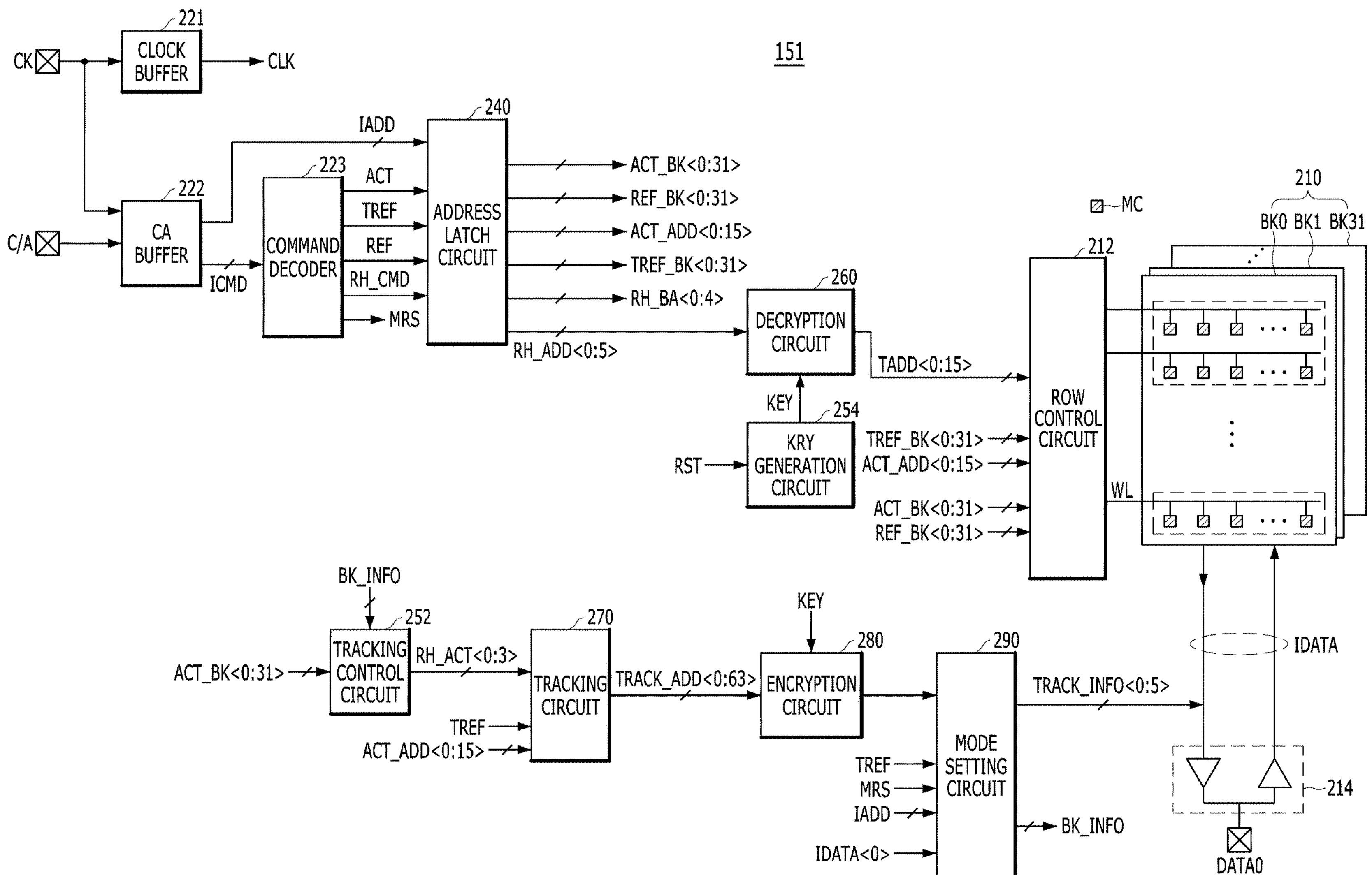
FIG. 3
151
CK
C/A
221
CLOCK BUFFER
CLK
222
CA BUFFER
ICMD
223
COMMAND DECODER
IADD
ACT
TREF
REF
RH_CMD
MRS
240
ADDRESS LATCH CIRCUIT
ACT_BK<0:31>
REF_BK<0:31>
ACT_ADD<0:15>
TREF_BK<0:31>
RH_BA<0:4>
RH_ADD<0:5>
260
DECRYPTION CIRCUIT
KEY
254
KRY GENERATION CIRCUIT
RST
TADD<0:15>
TREF_BK<0:31>
ACT_ADD<0:15>
ACT_BK<0:31>
REF_BK<0:31>
212
ROW CONTROL CIRCUIT
MC
WL
210
BK0 BK1 BK31
IDATA
214
DATA0
BK_INFO
252
TRACKING CONTROL CIRCUIT
ACT_BK<0:31>
RH_ACT<0:3>
270
TRACKING CIRCUIT
TREF
ACT_ADD<0:15>
TRACK_ADD<0:63>
KEY
280
ENCRYPTION CIRCUIT
290
MODE SETTING CIRCUIT
TREF
MRS
IADD
IDATA<0>
TRACK_INFO<0:5>
BK_INFO 270
ACT_ADD<0:15>
276
TRACK_ADD<0:63>
LAT_B0 (SAM_ADD0<0:15>)
LAT_B1 (SAM_ADD1<0:15>)
LAT_B2 (SAM_ADD2<0:15>)
LAT_B3 (SAM_ADD3<0:15>)
SAM_BK<0>
SAM_BK<1>
SAM_BK<2>
SAM_BK<3>
TREF
TREF
TREF
TREF
SAM_BK<0:3>
274
INPUT CONTROL CIRCUIT
RH_ACT<0:3>
SAM_EN
272
SAMPLING SIGNAL GENERATION CIRCUIT

MEMORY SYSTEM AND MEMORY MODULE INCLUDING MEMORY CHIPS SHARING CHANNEL

CROSS-REFERENCE TO RELATED APPLICATIONS

The present application claims the benefit of U.S. Provisional Patent Application No. 63/125,062, filed on Dec. 14, 2020, and Korean Patent Application No. 10-2021-0134743, filed on Oct. 12, 2021, which are both incorporated herein by reference in their entirety.

BACKGROUND

1. Field

Various embodiments of the present invention relate to a semiconductor design technology, and more particularly, to a memory module including a plurality of memory chips that perform a target refresh operation.

2. Description of the Related Art

A memory cell of a semiconductor memory device includes a transistor that functions as a switch and a capacitor that stores charges (or data). Data is determined to be at a logic high level (logic level 1) and at a logic low level (logic level 0) according to whether there is any charge in the capacitor of a memory cell, that is, whether the terminal voltage of the capacitor is high or low.

Data are stored in a form in which charges are accumulated in a capacitor, and theoretically, there is no power consumption. However, since there may be a leakage current due to such reasons as a PN coupling of a transistor, the initial amount of charges stored in the capacitor may disappear, which leads to the loss of data. To prevent this from occurring, the data in a memory cell should be read before the data gets lost, and the normal amount of charges according to the read data should be recharged back into the memory cell. The data may be retained only when such an operation is repeated periodically, and the process of recharging cell charges is referred to as a refresh operation which will be, hereinafter, referred to as a normal refresh operation.

Recently, in addition to the normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on a word line that is activated more than a predetermined number of times which is, hereinafter, referred to as a 'target word line', and the word lines disposed adjacent to the word line.

Moreover, a memory module such as a dual in-line memory module (DIMM) includes a plurality of memory chips each including a plurality of banks. Each of the memory chips may track addresses to word lines (i.e., word lines in which access is concentrated) having a high row-hammer risk for all banks, and perform a target refresh operation according to a tracking result.

SUMMARY

Embodiments of the present invention are directed to a memory system including a plurality of memory chips sharing a channel and a memory controller, each of the memory chips including a plurality of banks and capable of providing tracking information on a row-hammer risk for allocated banks among the plurality of banks, and the memory controller capable of collecting the tracking information provided from the memory chips and providing a row-hammer address to the memory chips.

Embodiments of the present invention are directed to a memory system including a plurality of memory chips sharing a channel and a memory controller, each of the memory chips capable of encrypting tracking information for allocated banks to output the encrypted tracking information to the memory controller and performing a target refresh operation by decrypting a row-hammer address transmitted from the memory controller.

According to an embodiment of the present invention, a memory system includes: a plurality of memory chips each including a plurality of banks and each suitable for generating a tracking address by tracking a row-hammer risk of selected banks among the banks, encrypting the tracking address using an encryption key to output tracking information to a corresponding data bus of a plurality of data buses and performing a target refresh operation according to a row-hammer address transferred through a command/address bus; and a memory controller suitable for collecting the tracking information for the banks transferred through the plurality of data buses to generate and output the row-hammer address to the command/address bus.

According to an embodiment of the present invention, a memory module includes: a command/address bus; a plurality of data buses; and a plurality of memory chips each including a plurality of banks and each suitable for generating a tracking address by tracking a row-hammer risk of selected banks among the banks, encrypting the tracking address using an encryption key to output tracking information to a corresponding data bus of the data buses and performing a target refresh operation according to a row-hammer address transferred through the command/address bus.

According to an embodiment of the present invention, an operation method of a memory system includes: generating, at each of memory chips, a tracking address by tracking a row-hammer risk of selected banks among a plurality of banks included in each of the memory chips; encrypting, at each of the memory chips, the tracking address using an encryption key to output tracking information to a corresponding data bus of a plurality of data buses; collecting, at a memory controller, the tracking information for the banks transferred through the plurality of data buses to generate and output a row-hammer address to a command/address bus; and performing, at each of the memory chips, a target refresh operation according to the row-hammer address transferred through the command/address bus.

According to embodiments of the present invention, each memory chip may track a row-hammer risk of only the allocated banks among the banks, thereby minimizing the area occupied by a tracking circuit.

According to embodiments of the present invention, each memory chip may encrypt and transmit the tracking information, thereby improving the security of the memory system.

BRIEF DESCRIPTION OF THE DRAWINGS

FIG. 3 is a detailed block diagram illustrating a memory chip in accordance with an embodiment of the present invention.

DETAILED DESCRIPTION

Figure 1:
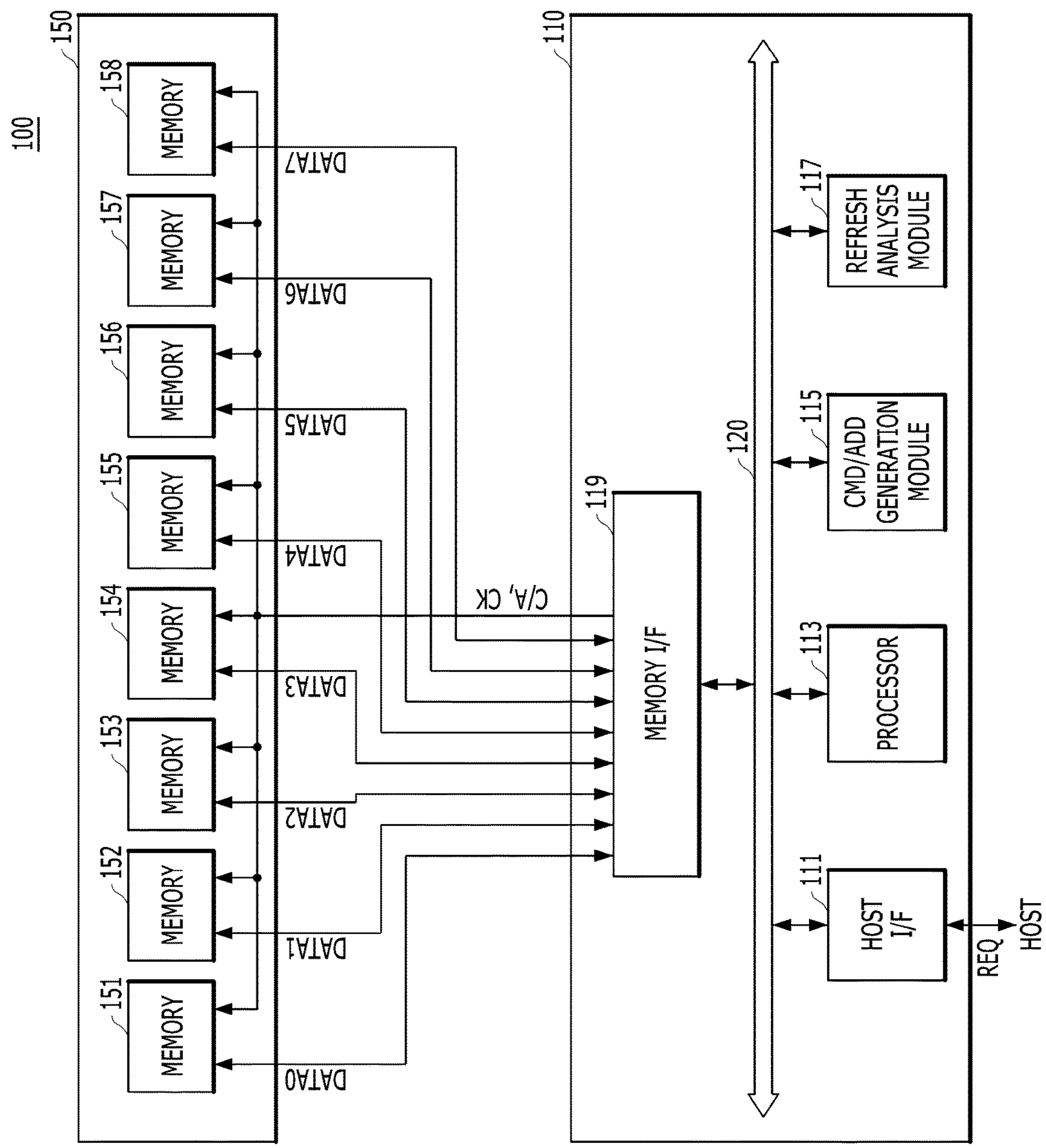
FIG. 1 is a block diagram illustrating a memory system in accordance with an embodiment of the present invention.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating a memory system 100 in accordance with an embodiment of the present invention.

Referring to FIG. 1, the memory system 100 may include a memory controller 110, and a memory module 150.

The memory controller 110 may control the general operation of the memory system 100 and it may control general data exchange between a host and the memory module 150. The memory controller 110 may generate a command/address signal C/A according to a request REQ from the host, and provide the generated command/address signal C/A to the memory module 150. The memory controller 110 may provide a clock CK together with the command/address signal C/A to the memory module 150. The memory controller 110 may provide data pieces DATA0 to DATA7 corresponding to the request REQ provided from the host to the memory module 150. The memory controller 110 may receive the data pieces DATA0 to DATA7 read from the memory module 150, and provide the data pieces DATA0 to DATA7 to the host. Depending on an embodiment, the memory controller 110 may transmit and receive the data pieces DATA0 to DATA7 together with a data strobe signal DQS, to/from the memory module 150.

The memory module 150 may include a plurality of memory chips (e.g., first to eighth memory chips 151 to 158). The first to eighth memory chips 151 to 158 may share a channel. That is, the first to eighth memory chips 151 to 158 may receive the command/address signal C/A and the clock CK in common from the memory controller 110 through the shared channel. On the other hand, the first to eighth memory chips 151 to 158 may transfer/receive different data pieces DATA0 to DATA7 to/from the memory controller 110. In other words, a command/address bus between the memory controller 110 and the memory chips 151 to 158 may be shared by the memory chips 151 to 158 as a common bus, while data buses between the memory controller 110 and the memory chips 151 to 158 are independent buses separated from each other for each of the memory chips 151 to 158. Each of the memory chips 151 to 158 may transfer/receive different data pieces DATA0 to DATA7 through a dedicated bus among the data buses.

The first to eighth memory chips 151 to 158 may perform operations such as a read operation, a write operation, and a refresh operation, under the control of the memory controller 110. Since the first to eighth memory chips 151 to 158 receive the same command/address signal C/A from the memory controller 110, the first to eighth memory chips 151 to 158 may perform a read operation, a write operation, and a refresh operation at the same time. For example, in order that the memory controller 110 writes 512-bit data to the memory module 150 in a write operation, 64-bit data may be written in each of the first to eighth memory chips 151 to 158. Also, in a read operation, the 64-bit data may be read from each of the first to eighth memory chips 151 to 158 so that the 512-bit data can be transferred from the memory module 150 to the memory controller 110. In other words, the 512-bit data word may be distributed in the first to eighth memory chips 151 to 158 during a write operation, and the 512-bit data word may be read by reading the 64-bit data from the first to eighth memory chips 151 to 158 during a read operation. The memory module 150 may be a Dual In-line Memory Module (DIMM).

In detail, the memory controller 110 may include a host interface 111, a processor 113, a command/address (CMD/ADD) generation module 115, a refresh analysis module 117, a memory interface 119, and a bus 120.

The host interface 111 may be configured to communicate with the host connected to the memory system 100 under the control of the processor 113. For example, the host interface 111 may receive the request REQ from the host, and provide the data pieces DATA0 to DATA7 read from the memory interface 119 to the host.

The processor 113 may perform various types of computational and/or other operations for controlling the memory module 150, and/or may execute instructions in the form of firmware or other types of software. The processor 113 may receive the request REQ from the host through the host interface 111. The processor 113 may decide the order of the requests REQ to be transferred to the memory module 150, among the requests REQ from the host. The processor 113 may schedule the requests REQ received from the host and operations to be processed by the memory module 150 differently in order to improve the performance of the memory module 150. For example, even though the host requests a read operation of the memory module 150 first and then requests a write operation later, the processor 113 may adjust the order in such a manner that the write operation is performed prior to the read operation. The processor 113 may transfer the data pieces DATA0 to DATA7 corresponding to the request REQ to the memory interface 119. The processor 113 may control overall operations of the host interface 111, the command/address generation module 115, the refresh analysis module 117, and the memory interface 119.

The command/address generation module 115 may generate the command/address signal C/A according to the schedule of the operations determined by the processor 113. For example, the command/address generation module 115 may provide an address together with an active command (ACT of FIG. 3), as the command/address signal C/A, provide an address together with a mode register command (MRS of FIG. 3) as the command/address signal C/A, provide a refresh command (REF of FIG. 3) as the command/address signal C/A, and provide a row-hammer address together with a row-hammer command (RH_CMD of FIG. 3) as the command/address signal C/A. The mode register command MRS may include a mode register write command MRW for storing and reading out setting data into a mode register set (MRS) circuit disposed in each of the first to eighth memory chips 151 to 158, and a mode register read command MRR for reading out the stored setting data.

The refresh analysis module 117 may generate the row-hammer address based on the data pieces DATA0 to DATA7 respectively transferred from the first to eighth memory chips 151 to 158 through the memory interface 119. Each of the first to eighth memory chips 151 to 158 may include a plurality of banks. In accordance with an embodiment, the data pieces DATA0 to DATA7 respectively transferred from the first to eighth memory chips 151 to 158 may include tracking information for different banks. The refresh analysis module 117 may generate the row-hammer address by collecting the tracking information for different banks included in the data pieces DATA0 to DATA7.

The memory interface 119 may be configured to communicate with the memory module 150 under the control of the processor 113. For example, the memory interface 119 may transmit the command/address signal C/A and the data pieces DATA0 to DATA7 to the memory module 150, and transmit the data pieces DATA0 to DATA7 read from the memory module 150 to the host interface 111.

The processor 113 may transmit data between the host interface 111, the command/address generation module 115, the refresh analysis module 117, and the memory interface 119 via the bus 120. According to an embodiment, the host interface 111, the command/address generation module 115, the refresh analysis module 117, and the memory interface 119 may communicate with each other independently without passing through the bus 120. For example, the refresh analysis module 117 and host interface 111 may communicate directly with each other without passing through the bus 120. The refresh analysis module 117 and the memory interface 119 may communicate with each other directly without passing through the bus 120. The host interface 111 and the memory interface 119 may also communicate directly with each other without passing through the bus 120.

Figure 2:
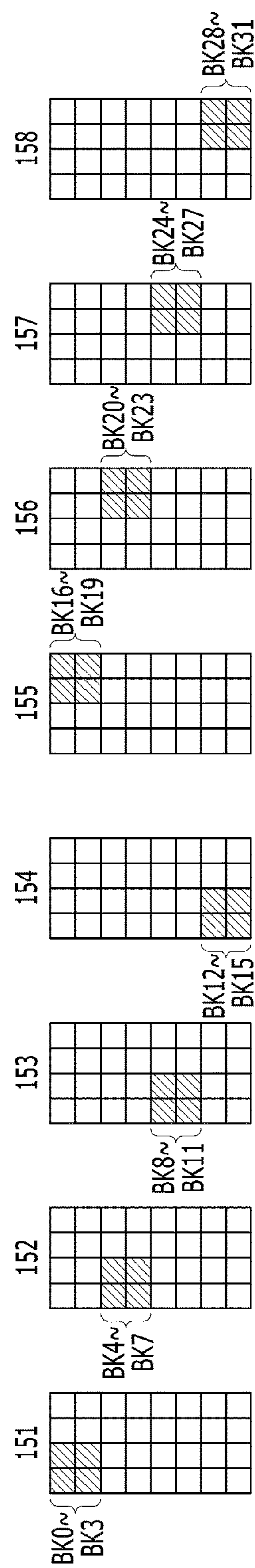
FIG. 2 is a diagram illustrating banks selected within a plurality of memory chips of FIG. 1 in accordance with an embodiment of the present invention.

FIG. 2 is a diagram illustrating banks selected within each of the first to eighth memory chips 151 to 158 of FIG. 1.

Referring to FIG. 2, each of the first to eighth memory chips 151 to 158 may include first to 32-th banks BK0 to BK31. In accordance with an embodiment, the plurality of banks within a plurality of memory chips may be divided into a plurality of groups including different banks, and one of the plurality of groups may be selected within each of the plurality of memory chips. Here, the selected groups of the respective memory chips may be in different locations in each of the memory chips. Information on banks included in the selected group (hereinafter, referred to as "target bank information") is stored in each memory chip, and each of the memory chips may track only a row-hammer risk for the selected banks according to the target bank information.

For example, the first to 32-th banks BK0 to BK31 within each of the first to eighth memory chips 151 to 158 are divided into first to eighth groups, within each of which 4 banks are sequentially included. At this time, the first to fourth banks BK0 to BK3 included in the first group are selected within the first memory chip 151, the fifth to eighth banks BK4 to BK7 included in the second group are selected within the second memory chip 152, and, in this way, the 29th to 32-th banks BK28 to BK31 included in the eighth group are selected within the eighth memory chip 158. Here, the selected groups of the first to eighth memory chips 151 to 158 may be in different locations in each of the first to eighth memory chips 151 to 158. The first to eighth memory chips 151 to 158 may track only the row-hammer risk for banks included in each selected group. The first to eighth memory chips 151 to 158 may store tracking information for the selected banks in the mode register set circuit, and may output the stored tracking information for selected banks by including it in the respective data pieces DATA0 to DATA7, according to the mode register command MRS (e.g., the mode register read command MRR).

Although it is described as an example that the first to 32-th banks BK0 to BK31 are divided into first to eighth groups, within each of which 4 banks are sequentially included, the present invention is not limited thereto. According to an embodiment, the first to 32-th banks BK0 to BK31 are divided into first to eighth groups, within each of which 4 banks are randomly or non-sequentially included.

The refresh analysis module 117 may generate the row-hammer address by collecting the tracking information for different banks included in the respective data pieces DATA0 to DATA7. Accordingly, in accordance with the embodiment, the row-hammer risk can be mitigated with a minimum area.

Further, in accordance with the embodiment, when outputting the tracking information for the selected banks by including it in the respective data pieces DATA0 to DATA7, the first to eighth memory chips 151 to 158 of the memory module 150 may encrypt and output the tracking information for the selected banks, and perform a target refresh operation by decrypting the row-hammer address provided from the memory controller 110. Accordingly, in accordance with an embodiment, the security of the memory system may be improved.

Hereinafter, referring to FIGS. 3 to 5, a detailed configuration of the first to eighth memory chips 151 to 158 will be described.

FIG. 3 is a detailed block diagram illustrating the first memory chip 151 in accordance with an embodiment of the present invention. Each of the second to eighth memory chips 152 to 158 may include substantially the same configuration as the first memory chip 151.

Referring to FIG. 3, the first memory chip 151 may include a memory cell array 210, a row control circuit 212, a data input/output (I/O) circuit 214, a clock buffer 221, a command/address (CA) buffer 222, a command decoder 223, an address latch circuit 240, a tracking control circuit 252, a key generation circuit 254, a decryption circuit 260, a tracking circuit 270, an encryption circuit 280, and a mode setting circuit 290.

The memory cell array 210 may include first to 32-th banks. In each of the first to 32-th banks, a plurality of memory cells MC coupled to word lines WL and bit lines, may be arranged in the form of an array. The number of the first to 32-th banks or the number of memory cells MC may be determined depending on the capacity of the first memory chip 151.

The clock buffer 221 may receive a clock CK from the memory controller 110. The clock buffer 221 may generate an internal clock CLK by buffering the clock CK. Depending on an embodiment, the memory controller 110 may transfer system clocks CK_t and CK_c to the first memory chip 151 in a differential manner, and the first memory chip 151 may include clock buffers that receive the differential clocks CK_t and CK_c, respectively.

The CA buffer 222 may receive a command/address signal C/A from the memory controller 110 based on the clock CK. The CA buffer 222 may sample the command/address signal C/A based on the clock CK and output an internal command ICMD and an internal address IADD. Consequently, the first memory chip 151 may be synchronized with the clock CK.

The command decoder 223 may decode the internal command ICMD which is output from the CA buffer 222 to generate an active command ACT, a refresh command REF, a target refresh command TREF, a mode register command MRS, and a row-hammer command RH_CMD. The active command ACT may be a command for performing an active operation for activating at least one word line WL, the refresh command REF may be a command for performing a normal refresh operation for sequentially refreshing the plurality of word lines WL, and the mode register command MRS may be a command for storing setting data in a mode register set circuit (i.e., the mode setting circuit 290), and/or outputting the stored setting data. The mode register command MRS may include a mode register write command MRW for storing and reading out setting data into the mode setting circuit 290, and a mode register read command MRR for reading out the stored setting data from the mode setting circuit 290. The command decoder 223 may generate the target refresh command TREF whenever a number of inputs of the refresh command REF reaches a set number. The row-hammer command RH_CMD may be a command for providing a row-hammer address to each memory chip from the memory controller 110 by collecting the tracking information for different banks included in the data pieces DATA0 to DATA7 respectively transferred from each memory chip. Although not illustrated, the command decoder 223 may additionally generate a read command, a write command, a precharge command, and the like by decoding the internal command ICMD.

The address latch circuit 240 may latch and decode the internal address IADD to generate a plurality of bank active signals ACT_BK<0:31>, a plurality of bank refresh signals REF_BK<0:31>, an active address ACT_ADD<0:15>, a plurality of target bank refresh signals TREF_BK<0:31>, a row-hammer bank address RH_BA<0:4>, and a row-hammer row address RH_ADD<0:5>, according to the active command ACT, the refresh command REF, the target refresh command TREF, and the row-hammer command RH_CMD. The row-hammer bank address RH_BA<0:4> and the row-hammer row address RH_ADD<0:5> may be defined as the row-hammer address.

Figure 5:
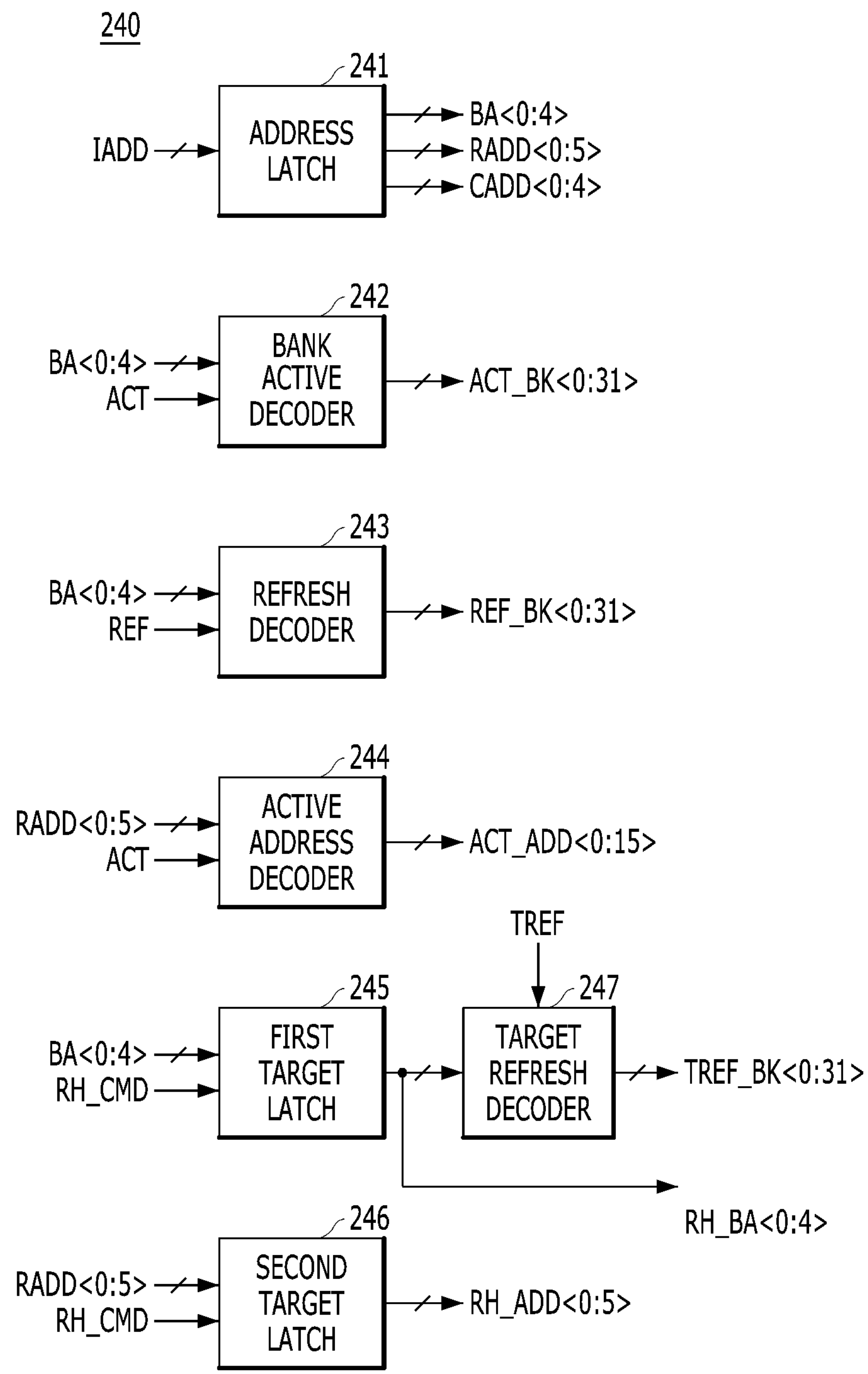
FIG. 5 is a detailed block diagram illustrating an address latch circuit of FIG. 3 in accordance with an embodiment of the present invention.

In detail, the address latch circuit 240 may latch the internal address IADD to generate a bank address (BA<0:4> of FIG. 5), a row address (RADD<0:5> of FIG. 5), and a column address (CADD<0:4> of FIG. 5). The address latch circuit 240 may generate the bank active signals ACT_BK<0:31> respectively corresponding to the banks, by decoding the bank address BA<0:4> according to the active command ACT. The address latch circuit 240 may generate the bank refresh signals REF_BK<0:31> respectively corresponding to the banks, by decoding the bank address BA<0:4> according to the refresh command REF. The address latch circuit 240 may generate the active address ACT_ADD<0:15> by latching the internal address IADD according to the active command ACT. The address latch circuit 240 may generate the row-hammer bank address RH_BA<0:4> by latching the bank address BA<0:4> according to the row-hammer command RH_CMD. The address latch circuit 240 may generate the target bank refresh signals TREF_BK<0:31> based on the row-hammer bank address RH_BA<0:4> and the target refresh command TREF. The address latch circuit 240 may generate the row-hammer row address RH_ADD<0:5> by latching the row address RADD<0:5> according to the row-hammer command RH_CMD. Though it is not shown, the memory chip 151 may further include a column control circuit which for selecting bit lines corresponding to the column address CADD<0:4>, according to the read command or the write command. A detailed configuration of the address latch circuit 240 will be described in FIG. 5.

The tracking control circuit 252 may generate a plurality of per-bank active signals RH_ACT<0:3> by extracting some from the bank active signals ACT_BK<0:31> based on a target bank information BK_INFO, the extracted bank active signals corresponding to the selected banks. For example, in case of the first memory chip 151, the tracking control circuit 252 may generate first to fourth per-bank active signals RH_ACT<0:3> respectively corresponding to the first to fourth banks BK0 to BK3 selected among the first to 32-th banks BK0 to BK31. For reference, the target bank information BK_INFO may include information on 4 banks selected to track among the first to 32-th banks BK0 to BK31. The target bank information BK_INFO may be stored in the mode setting circuit 290, and provided to the tracking control circuit 252 from the mode setting circuit 290.

The key generation circuit 254 may generate an encryption key KEY in response to a reset signal RST. That is, the key generation circuit 254 may generate the encryption key KEY whenever the corresponding memory chip is reset or initialized.

The decryption circuit 260 may generate a target address TADD<0:15> by decrypting the row-hammer row address RH_ADD<0:5> using the encryption key KEY. A detailed configuration of the decryption circuit 260 will be described in FIG. 6.

The tracking circuit 270 may track the row-hammer risk of the selected banks, e.g., the first to fourth banks BK0 to BK3, according to the first to fourth per-bank active signals RH_ACT<0:3>, and output a tracking address TRACK_ADD<0:63> according to the target refresh command TREF. The tracking circuit 270 may perform a tracking operation by storing sampling addresses for the selected banks by randomly sampling the active address ACT_ADD<0:15> inputted to the selected banks, according to the first to fourth per-bank active signals RH_ACT<0:3>. The tracking circuit 270 may output the sampling addresses stored therein, as the tracking address TRACK_ADD<0:63>, according to the target refresh command TREF. A detailed configuration of the tracking circuit 270 will be described in FIG. 7.

The encryption circuit 280 may generate tracking information TRACK_INFO<0:5> by encrypting the tracking address TRACK_ADD<0:63> using the encryption key KEY. A detailed configuration of the encryption circuit 280 will be described in FIG. 8.

The mode setting circuit 290 may perform various setting operations by decoding at least some bits of the internal address IADD in response to the mode register command MRS. The mode setting circuit 290 may be implemented as a known mode register set (MRS) circuit. The mode setting circuit 290 may store the tracking information TRACK_INFO<0:5> output from the encryption circuit 280, and provide the stored tracking information TRACK_INFO<0:5> through an internal data bus to the data I/O circuit 214 in response to the mode register read command MRR. Depending on an embodiment, the mode setting circuit 290 may store the tracking information TRACK_INFO<0:5> output from the encryption circuit 280 according to the target refresh command TREF. Furthermore, a per-DRAM addressability (PDA) mode may be supported to perform an independent mode register set operation (i.e., a setting operation) for each memory chip to which the data buses are separated. The mode setting circuit 290 may determine whether to enter the PDA mode according to a specific bit (e.g., first bit IDATA<0>) of internal data IDATA, set the target bank information BK_INFO according to the internal address IADD in the PDA mode, and provide the set target bank information BK_INFO to the tracking control circuit 252. An operation in the PDA mode of the mode setting circuit 290 will be described with reference to FIG. 4.

The data I/O circuit 214 may receive the data DATA0 from the memory controller 110 to load the data DATA0 on the internal data bus as the internal data IDATA, or transmit the internal data IDATA read from the memory cell array 210 through the internal data bus, as the data DATA0, to the memory controller 110. In particular, the data I/O circuit 214 may output the tracking information TRACK_INFO<0:5> to be included in the data DATA0 when the tracking information TRACK_INFO<0:5> is outputted from the mode setting circuit 290 in response to the mode register read command MRR.

The row control circuit 212 may activate at least one word line WL corresponding to the active address ACT_ADD<0:15> according to the bank active command ACT_BK<0:31>, and precharge the activated word line WL according to the precharge command. In order to select a word line to be refreshed during the normal refresh operation, a refresh counter (not shown) for generating a counting address that is sequentially increasing according to the refresh command REF may be additionally provided. The row control circuit 212 may perform the normal refresh operation of sequentially refreshing the plurality of word lines WL corresponding to the counting address according to the bank refresh signals REF_BK<0:31>. The row control circuit 212 may perform the target refresh operation of refreshing one or more neighboring word lines of a word line WL corresponding to the target address TADD<0:15> according to the target bank refresh signals TREF_BK<0:31>.

Figure 4:
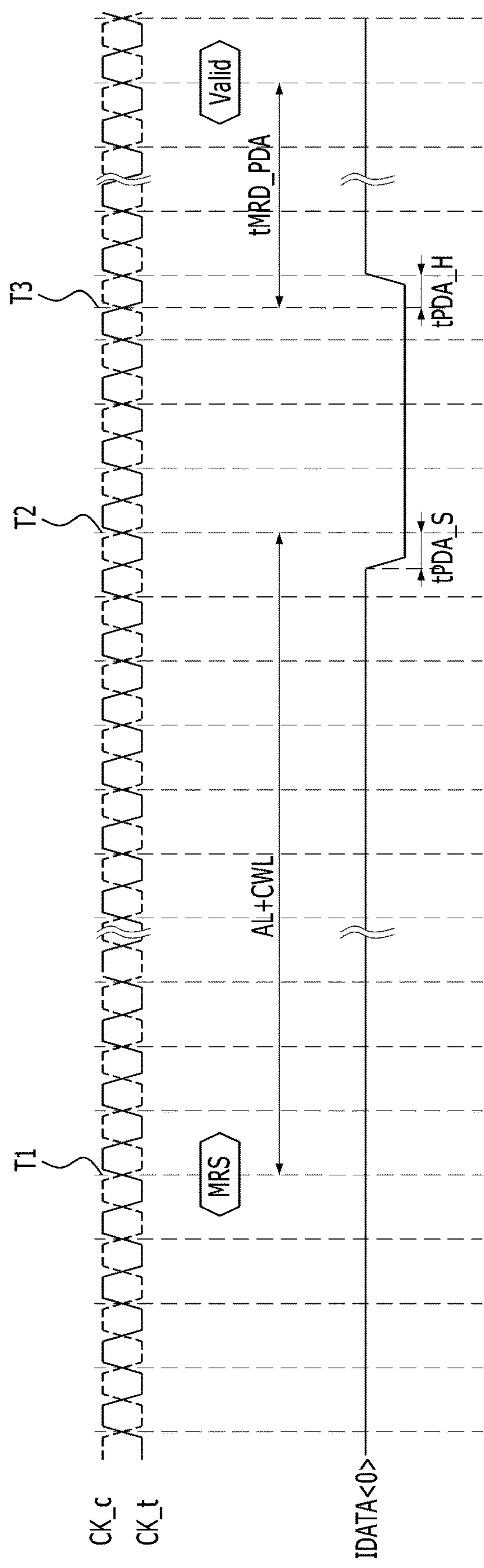
FIG. 4 is a timing diagram for describing an operation of a mode setting circuit during a PDA (Per-DRAM Addressability) mode in accordance with an embodiment of the present invention.

FIG. 4 is a timing diagram for describing an operation of the mode setting circuit 290 during the PDA mode in accordance with an embodiment of the present invention.

Referring to FIG. 4, in order to enter the PDA mode, a validity of the mode register command MRS may be determined according to a signal level of a specific bit (e.g., a first bit IDATA<0>) of the internal data IDATA. If the signal level of the first bit IDATA<0> is '0' at a moment when a write latency WL (which is a sum of an Additive Latency AL and a CAS Write Latency CWL, WL=AL+CWL) passes from a moment when the mode register command MRS is applied, the applied mode register command MRS may be determined to be valid; however, if the signal level of the first bit IDATA<0> is '1', the applied mode register command MRS may be determined to be invalid and thus disregarded.

For example, at a timing T1, the mode register command MRS may be applied to the memory chip. At a timing T2 when time passes by for as much as a write latency WL (WL=AL+CWL) from the timing T1, the signal level of the first bit IDATA<0> may transition to '0' for a predetermined duration. Therefore, the mode register command MRS applied at the timing T1 may be determined to be valid, and thus a setup operation of the memory chip may begin based on the internal address IADD inputted along with the mode register command MRS for a duration tMRD_PDA, which is a mode register set command cycle time, from a timing T3.

If the signal level of the first bit IDATA<0> is maintained to be '1' at the timing T2, the mode register command MRS applied at the timing T1 may be determined to be invalid and disregarded. In other words, the setup operation of the memory chip may not be performed.

In accordance with an embodiment, the mode setting circuit 290 may determine whether to enter the PDA mode according to the first bit IDATA<0> of internal data IDATA, and set the target bank information BK_INFO corresponding to the internal address IADD transmitted in the PDA mode, to thereby provide the set target bank information BK_INFO to the tracking control circuit 252.

FIG. 5 is a detailed block diagram illustrating the address latch circuit 240 of FIG. 3 in accordance with an embodiment of the present invention.

Referring to FIG. 5, the address latch circuit 240 may include an address latch 241, a bank active decoder 242, a refresh decoder 243, an active address decoder 244, a first target latch 245, a second target latch 246, and a target refresh decoder 247.

The address latch 241 may latch the internal address IADD to generate the bank address BA<0:4>, the row address (RADD<0:5>, and the column address CADD<0:4>.

The bank active decoder 242 may generate first to 32-th bank active signals ACT_BK<0:31> by decoding the bank address BA<0:4> according to the active command ACT. The first to 32-th bank active signals ACT_BK<0:31> may respectively correspond to the first to 32-th banks BK0 to BK31. For example, the first bank active signal ACT_BK<0> is used as an active command of the first bank BK0.

The refresh decoder 243 may generate first to 32-th bank refresh signals REF_BK<0:31> by decoding the bank address BA<0:4> according to the refresh command REF. The first to 32-th bank refresh signals REF_BK<0:31> may respectively correspond to the first to 32-th banks BK0 to BK31. For example, the first bank refresh signal REF_BK<0> is used as a refresh command of the first bank BK0.

The active address decoder 244 may generate the active address ACT_ADD<0:15> by latching the internal address IADD according to the active command ACT.

The first target latch 245 may generate the row-hammer bank address RH_BA<0:4> by latching the bank address BA<0:4> according to the row-hammer command RH_CMD.

The second target latch 246 may generate the row-hammer row address RH_ADD<0:5> by latching the row address RADD<0:5> according to the row-hammer command RH_CMD.

The target refresh decoder 247 may generate first to 32-th target bank refresh signals TREF_BK<0:31> by decoding the row-hammer bank address RH_BA<0:4> in response to the target refresh command TREF. The target refresh decoder 247 may decode the row-hammer bank address RH_BA<0:4> when the target refresh command TREF is inputted, to thereby output the first to 32-th target bank refresh signals TREF_BK<0:31>. The first to 32-th target bank refresh signals TREF_BK<0:31> may respectively correspond to the first to 32-th banks BK0 to BK31. For example, the first target bank refresh signal TREF_BK<0> is used as a target refresh command of the first bank BK0.

Figure 6:
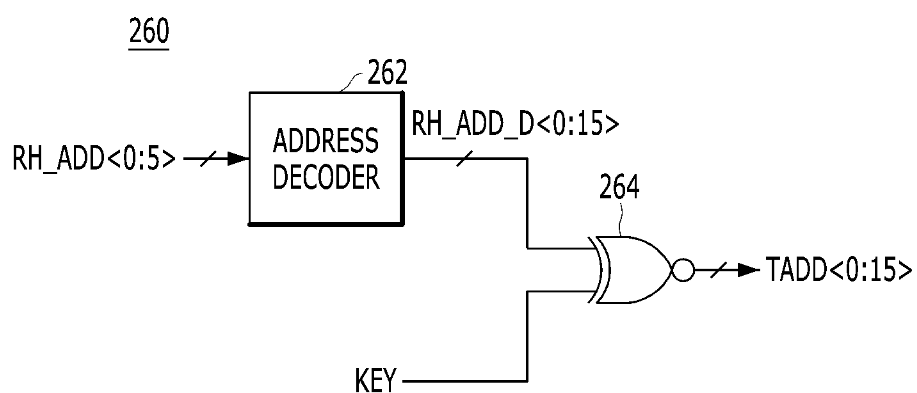
FIG. 6 is a detailed block diagram illustrating a decryption circuit of FIG. 3 in accordance with an embodiment of the present invention.

FIG. 6 is a detailed block diagram illustrating the decryption circuit 260 of FIG. 3 in accordance with an embodiment of the present invention.

Referring to FIG. 6, the decryption circuit 260 may include an address decoder 262 and a decryptor 264.

The address decoder 262 may generate a decoded row-hammer row address RH_ADD_D<0:15> by decoding the row-hammer row address RH_ADD<0:5>.

The decryptor 264 may generate the target address TADD<0:15> by decrypting the decoded row-hammer row address RH_ADD_D<0:15> using the encryption key KEY. The decryptor 264 may use various types of decryption methods corresponding to encryption methods used by the encryption circuit 260. For example, the decryptor 264 may be implemented with a logic exclusive OR (XOR) gate for performing an XOR operation on the encryption key KEY and the decoded row-hammer row address RH_ADD_D<0:15>. The number of bits of the encryption key KEY and the number of bits of the decoded row-hammer row address RH_ADD_D<0:15> may be different. In this case, the encryption key KEY may be copied and used. For example, when the encryption key KEY is composed of 4 bits and the decoded row-hammer row address RH_ADD_D<0:15> is composed of 16 bits, the decryptor 264 may copy the encryption key KEY to form 16 bits and perform an XOR operation on the copied encryption key of 16 bits and the decoded row-hammer row address RH_ADD_D<0:15>. As a result, the decryptor 264 may output the target address TADD<0:15> of 16 bits.

Figure 7:
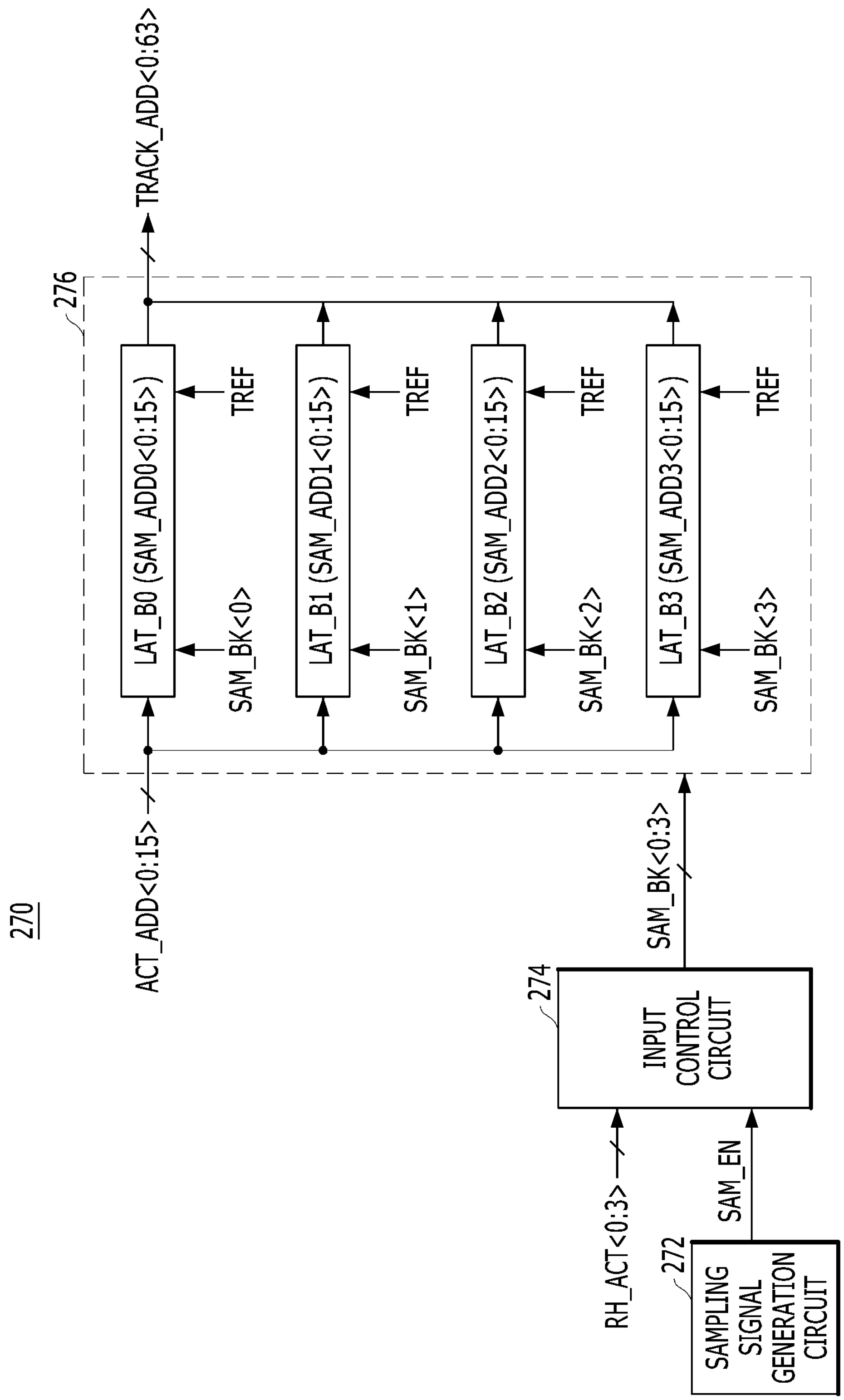
FIG. 7 is a detailed block diagram illustrating a tracking circuit of FIG. 3 in accordance with an embodiment of the present invention.

FIG. 7 is a detailed block diagram illustrating the tracking circuit 270 of FIG. 3.

Referring to FIG. 7, the tracking circuit 270 may include a sampling signal generation circuit 272, an input control circuit 274, and an address storing circuit 276

The sampling signal generation circuit 272 may generate a sampling signal SAM_EN that is randomly enabled. The sampling signal generation circuit 272 may be implemented with a pseudo-random binary sequence (PRBS) based random pattern generator, or a linear feedback shift register (LFSR) based random pattern generator.

The input control circuit 274 may generate first to fourth input control signals SAM_BK<0:3>, according to the first to fourth per-bank active signals RH_ACT<0:3> and the sampling signal SAM_EN. The input control circuit 274 may enable a corresponding input control signal when both of a corresponding input control signal and the sampling signal SAM_EN are enabled. Depending on an embodiment, the input control circuit 274 may be implemented with a logic AND gate for performing a logic AND operation on the first to fourth per-bank active signals RH_ACT<0:3> and the sampling signal SAM_EN.

The address storing circuit 276 may store the active address ACT_ADD<0:15> as first to fourth sample addresses SAM_ADD0<0:15> to SAM_ADD3<0:15>, according to the first to fourth input control signals SAM_BK<0:3>, respectively. The address storing circuit 276 may output all of the first to fourth sample addresses SAM_ADD0<0:15> to SAM_ADD3<0:15> as the tracking address TRACK_ADD<0:63> according to the target refresh command TREF. The address storing circuit 276 may include first to eighth latch circuits LAT_B0 to LAT_B3 respectively receiving the first to fourth input control signals SAM_BK<0:3>. In case of the first memory chip 151, the address storing circuit 276 may include the first to eighth latch circuits LAT_B0 to LAT_B3 respectively corresponding to the first to fourth banks BK0 to BK3. In case of the second memory chip 152, the address storing circuit 276 may include the first to eighth latch circuits LAT_B0 to LAT_B3 respectively corresponding to the fifth to eighth banks BK4 to BK7. Each of the latch circuits LAT_B0 to LAT_B3 may store the active address ACT_ADD<0:15> as its sample address when a corresponding control signal of the first to fourth input control signals SAM_BK<0:3> is enabled. The latch circuits LAT_B0 to LAT_B3 may output all of the first to fourth sample addresses SAM_ADD0<0:15> to SAM_ADD3<0:15> as the tracking address TRACK_ADD<0:63> when the target refresh command TREF is inputted.

The conventional memory chips had to have latch circuits corresponding to all banks to track the row-hammer risk, respectively. For example, when 32 banks were arranged in each memory chip, each memory chip required 32 latch circuits to track the row-hammer risk of 32 banks. On the other hand, in an embodiment of the proposed invention, even if each memory chip tracks a row-hammer risk only for four banks selected among 32 banks, the memory controller may collect bank-specific tracking information provided from each memory chip and finally provide a row-hammer address. Accordingly, the area occupied by the latch circuits may be reduced to 4/32, that is, 1/8.

Figure 8:
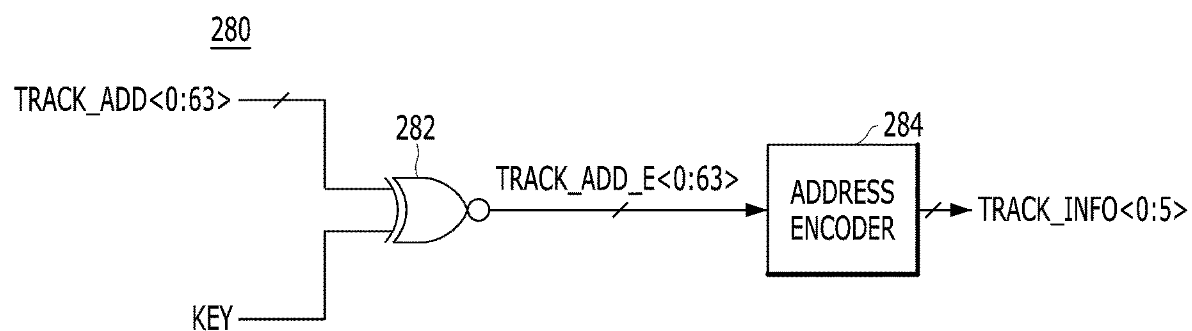
FIG. 8 is a detailed block diagram illustrating an encryption circuit of FIG. 3 in accordance with an embodiment of the present invention.

FIG. 8 is a detailed block diagram illustrating the encryption circuit 280 of FIG. 3 in accordance with an embodiment of the present invention.

Referring to FIG. 8, the encryption circuit 280 may include an encryptor 282 and an address encoder 284.

The encryptor 282 may generate an encryption address TRACK_ADD_E<0:63> by encrypting the tracking address TRACK_ADD<0:63> using the encryption key KEY. The encryptor 282 may use various types of encryption methods. For example, the encryptor 282 may be implemented with a logic exclusive OR (XOR) gate for performing an XOR operation on the encryption key KEY and the tracking address TRACK_ADD<0:63>. The number of bits of the encryption key KEY and the number of bits of the tracking address TRACK_ADD<0:63> may be different. In this case, the encryption key KEY may be copied and used. For example, when the encryption key KEY is composed of 4 bits and the tracking address TRACK_ADD<0:63> is composed of 64 bits, the encryptor 282 may copy the encryption key KEY to form 64 bits and perform an XOR operation on the copied encryption key of 64 bits and the tracking address TRACK_ADD<0:63>. As a result, the encryptor 282 may output the encryption address TRACK_ADD_E<0:63> of 64 bits.

The address encoder 284 may generate the tracking information TRACK_INFO<0:5> by encoding the encryption address TRACK_ADD_E<0:63>.

Hereinafter, referring to FIGS. 1 to 10, an operation of a memory system in accordance with an embodiment of the present invention will be described in detail.

Figure 9:
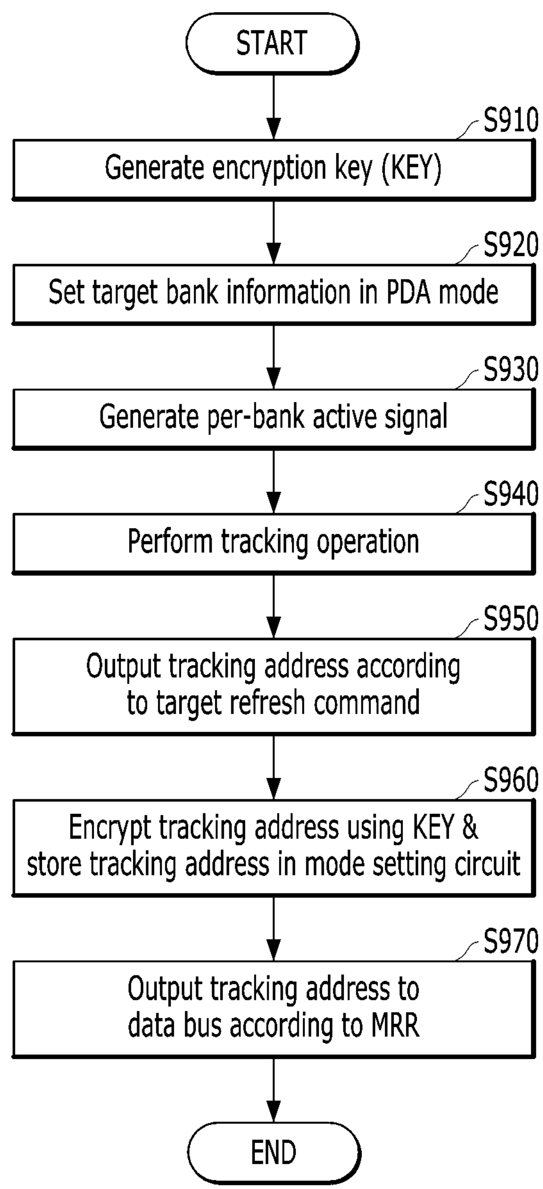
FIGS. 9 and 10 are flow charts for describing an operation of a memory system in accordance with an embodiment of the present invention.

FIG. 9 is a flow chart for describing an operation of a memory chip for outputting tracking information for selected banks to a memory controller, in accordance with an embodiment of the present invention.

Referring to FIG. 9, when the memory chips are initialized, the key generation circuit 254 of each memory chip may generate the encryption key KEY (at S910).

The command decoder 223 may decode the internal command ICMD to generate the active command ACT, the refresh command REF, the target refresh command TREF, and the mode register command MRS.

When the mode register command MRS is inputted, the mode setting circuit 290 may determine whether to enter the PDA mode according to the first bit IDATA<0> of internal data IDATA, and set the target bank information BK_INFO corresponding to the internal address IADD in the PDA mode, to thereby provide the set target bank information BK_INFO to the tracking control circuit 252 (at S920).

The address latch circuit 240 may generate the bank active signals ACT_BK<0:31> by decoding the bank address BA<0:4> of the internal address IADD according to the active command ACT. Thus, the row control circuit 212 may perform an active operation to activate at least one word line WL corresponding to the active address ACT_ADD<0:15> according to the bank active command ACT_BK<0:31>.

Moreover, the tracking control circuit 252 may generate the plurality of per-bank active signals RH_ACT<0:3> corresponding to the selected banks by extracting some from the bank active signals ACT_BK<0:31> based on a target bank information BK_INFO, the extracted bank active signals corresponding to the selected banks (at S930). For example, in case of the first memory chip 151, the tracking control circuit 252 may generate the first to fourth per-bank active signals RH_ACT<0:3> respectively corresponding to the first to fourth banks BK0 to BK3 selected among the first to 32-th banks BK0 to BK31.

The tracking circuit 270 may perform a tracking operation to track the row-hammer risk of the selected banks, e.g., the first to fourth banks BK0 to BK3, according to the first to fourth per-bank active signals RH_ACT<0:3> (at S940). In detail, the tracking circuit 270 may generate the first to fourth input control signals SAM_BK<0:3>, according to the first to fourth per-bank active signals RH_ACT<0:3> and the sampling signal SAM_EN, and store the active address ACT_ADD<0:15> as the first to fourth sample addresses SAM_ADD0<0:15> to SAM_ADD3<0:15>, according to the first to fourth input control signals SAM_BK<0:3>, respectively Thereafter, the command decoder 223 may generate the target refresh command TREF whenever a number of inputs of the refresh command REF reaches a set number. The tracking circuit 270 may output all of the first to fourth sample addresses SAM_ADD0<0:15> to SAM_ADD3<0:15> as the tracking address TRACK_ADD<0:63> according to the target refresh command TREF (at S950).

The encryption circuit 280 may generate the tracking information TRACK_INFO<0:5> by encrypting the tracking address TRACK_ADD<0:63> using the encryption key KEY, and the mode setting circuit 290 may store the tracking information TRACK_INFO<0:5> output from the encryption circuit 280 (at S960).

The mode setting circuit 290 may provide the stored tracking information TRACK_INFO<0:5> to the data I/O circuit 214 in response to the mode register read command MRR of the mode register command MRS. The data I/O circuit 214 may output the tracking information TRACK_INFO<0:5> to be included in the data DATA0 (at S970).

Thereafter, the refresh analysis module 117 of the memory controller 110 may generate the row-hammer address by collecting the tracking information TRACK_INFO<0:5> for different banks included in the data pieces DATA0 to DATA7 transferred from the first to eighth memory chips 151 to 158 through the memory interface 119. The command/address generation module 115 may provide the row-hammer address together with the row-hammer command RH_CMD as the command/address signal C/A.

Figure 10:
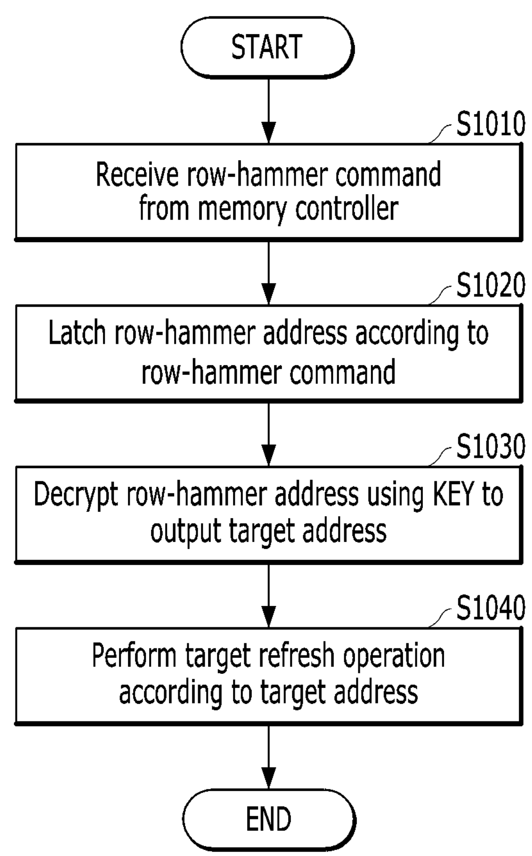

FIG. 10 is a flow chart for describing an operation of a memory chip for performing a target refresh operation according to a row-hammer address provided from a memory controller, in accordance with an embodiment of the present invention.

Referring to FIG. 10, the CA buffer 222 of each memory chip may receive the command/address signal C/A from the memory controller 110 to output the internal command ICMD and the internal address IADD. The command decoder 223 may decode the internal command ICMD to generate the refresh command REF, the target refresh command TREF, and the row-hammer command RH_CMD (at S1010).

The address latch circuit 240 may generate the row-hammer bank address RH_BA<0:4> and the row-hammer row address RH_ADD<0:5> by latching the bank address BA<0:4> and the row address RADD<0:5>, according to the row-hammer command RH_CMD (at S1020). The address latch circuit 240 may generate the first to 32-th target bank refresh signals TREF_BK<0:31> by decoding the row-hammer bank address RH_BA<0:4> according to the target refresh command TREF.

The decryption circuit 260 may generate the target address TADD<0:15> by decrypting the row-hammer row address RH_ADD<0:5> using the encryption key KEY (at S1030).

The row control circuit 212 may perform the target refresh operation of refreshing one or more neighboring word lines of a word line WL corresponding to the target address TADD<0:15> according to the target bank refresh signals TREF_BK<0:31> (at S1040).

In the above embodiment, it has been described that the first to 32-th banks BK0 to BK31 are sequentially grouped into four and one of the groups is selected within each of the first to eighth memory chips 151 to 158, but this invention is not limited thereto. According to an embodiment, a plurality of banks may be divided into groups in various ways and one of the groups is selected within each memory chip, and information on the selected banks may be stored in the mode setting circuit of each chip as target bank information.

As described above, in the memory system in accordance with various embodiments of the present invention, the memory chips sharing a channel may provide the tracking information only on the row-hammer risk for selected banks within each of the memory chips, and the memory controller may collect bank-specific tracking information and finally provide the row-hammer address. Accordingly, an area occupied by the tracking circuit may be minimized.

Furthermore, in the memory system in accordance with various embodiments of the present invention, each memory chip may encrypt the tracking information for the selected banks and transmit it to the memory controller, decrypt the row-hammer address transmitted from the memory controller, and perform a target refresh operation, thereby increasing the security of the memory system.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory system, comprising:

a plurality of memory chips each including a plurality of banks and each suitable for generating a tracking address by tracking a row-hammer risk of selected banks among the banks, encrypting the tracking address using an encryption key to output tracking information to a corresponding data bus of a plurality of data buses and performing a target refresh operation according to a row-hammer address transferred through a command/address bus; and a memory controller suitable for collecting the tracking information for the banks transferred through the plurality of data buses to generate and output the row-hammer address to the command/address bus.

2. The memory system of claim 1, wherein each of the memory chips is suitable for:

determining whether to enter a preset mode according to a specific bit of data transferred through the corresponding data bus, setting target bank information about the selected banks according to an address transferred through the command/address bus in the preset mode, and tracking the row-hammer risk of the selected banks based on the set target bank information.

3. The memory system of claim 1, wherein each of the memory chips is suitable for:

storing the encrypted tracking address as the tracking information in a mode setting circuit, and outputting the stored tracking information to the corresponding data bus in response to a mode register read command.

4. The memory system of claim 1, wherein the memory controller is suitable for providing a row-hammer command together with the row-hammer address to the command/address bus, and wherein each of the memory chips is suitable for latching the row-hammer address according to the row-hammer command, decrypting the row-hammer address using the encryption key to generate a target address and performing the target refresh operation on at least one word line corresponding to the target address.

5. The memory system of claim 1, wherein each of the memory chips includes:

a tracking circuit suitable for outputting the tracking address by tracking the row-hammer risk of the selected banks according to a plurality of per-bank active signals;

an encryption circuit suitable for generating the tracking information by encrypting the tracking address using the encryption key;

a mode setting circuit suitable for storing the tracking information outputted from the encryption circuit and outputting the stored tracking information to the corresponding data bus in response to a mode register read command;

a decryption circuit suitable for generating a target address by decrypting the row-hammer address using the encryption key; and a row control circuit suitable for performing the target refresh operation on at least one word line corresponding to the target address in response to a target refresh command.

6. The memory system of claim 5, wherein the mode setting circuit is suitable for:

setting information about the selected banks according to an address transferred through the command/address bus in a Per-DRAM Addressability (PDA) mode, and providing the set information as target bank information.

7. The memory system of claim 6, wherein each of the memory chips further includes a tracking control circuit suitable for providing the plurality of per-bank active signals from a plurality of bank active signals corresponding to the selected banks based on the target bank information.

8. The memory system of claim 5, wherein the tracking circuit includes:

a sampling signal generation circuit suitable for generating a sampling signal that is randomly enabled;

an input control circuit suitable for generating a plurality of input control signals according to the per-bank active signals and the sampling signal;

an address storing circuit suitable for storing an active address as a plurality of sample addresses according to the input control signals and outputting the sample addresses as the tracking address in response to the target refresh command.

9. The memory system of claim 5, wherein each of the memory chips further includes a key generation circuit suitable for generating the encryption key in response to a reset signal.

10. The memory system of claim 1, wherein the memory controller includes:

a host interface suitable for communicating with a host;

a processor suitable for receiving a request from the host through the host interface and scheduling operations of the memory chips;

a command/address generation module suitable for generating a command/address signal under a control of the processor;

a refresh analysis module suitable for generating the row-hammer address by collecting the tracking information transferred from the memory chips; and a memory interface suitable for communicating with the memory chips through the data buses and the command/address bus.

11. A memory module, comprising:

a command/address bus;

a plurality of data buses; and a plurality of memory chips each including a plurality of banks and each suitable for generating a tracking address by tracking a row-hammer risk of selected banks among the banks, encrypting the tracking address using an encryption key to output tracking information to a corresponding data bus of the data buses and performing a target refresh operation according to a row-hammer address transferred through the command/address bus.

12. The memory module of claim 11, wherein each of the memory chips includes:

a tracking circuit suitable for outputting the tracking address by tracking the row-hammer risk of the selected banks according to a plurality of per-bank active signals;

an encryption circuit suitable for generating the tracking information by encrypting the tracking address using the encryption key;

a mode setting circuit suitable for storing the tracking information outputted from the encryption circuit and outputting the stored tracking information to the corresponding data bus in response to a mode register read command;

a decryption circuit suitable for generating a target address by decrypting the row-hammer address using the encryption key; and a row control circuit suitable for performing the target refresh operation on at least one word line corresponding to the target address in response to a target refresh command.

13. The memory module of claim 12, wherein the mode setting circuit is suitable for:

setting information about the selected banks according to an address transferred through the command/address bus in a Per-DRAM Addressability (PDA) mode, and providing the set information as target bank information.

14. The memory module of claim 13, wherein each of the memory chips further includes a tracking control circuit suitable for providing the plurality of per-bank active signals from a plurality of bank active signals corresponding to the selected banks based on the target bank information.

15. The memory module of claim 12, wherein the tracking circuit includes:

a sampling signal generation circuit suitable for generating a sampling signal that is randomly enabled;

an input control circuit suitable for generating a plurality of input control signals according to the per-bank active signals and the sampling signal;

an address storing circuit suitable for storing an active address as a plurality of sample addresses according to the input control signals and outputting the sample addresses as the tracking address in response to the target refresh command.

16. The memory module of claim 12, wherein each of the memory chips further includes a key generation circuit suitable for generating the encryption key in response to a reset signal.

17. An operation method of a memory system, comprising:

generating, at each of memory chips, a tracking address by tracking a row-hammer risk of selected banks among a plurality of banks included in each of the memory chips;

encrypting, at each of the memory chips, the tracking address using an encryption key to output tracking information to a corresponding data bus of a plurality of data buses;

collecting, at a memory controller, the tracking information for the banks transferred through the plurality of data buses to generate and output a row-hammer address to a command/address bus; and performing, at each of the memory chips, a target refresh operation according to the row-hammer address transferred through the command/address bus.

18. The operation method of claim 17, wherein the generating includes:

setting information about the selected banks according to an address transferred through the command/address bus in a Per-DRAM Addressability (PDA) mode, and providing the set information as target bank information; and generating the tracking address by tracking the row-hammer risk of the selected banks based on the set target bank information.

19. The operation method of claim 18, wherein the generating includes:

generating a plurality of per-bank active signals from a plurality of bank active signals corresponding to the selected banks based on the target bank information;

generating a sampling signal that is randomly enabled;

generating a plurality of input control signals according to the per-bank active signals and the sampling signal; and storing an active address as a plurality of sample addresses in response to the input control signals and outputting the sample addresses as the tracking address in response to a target refresh command.

20. The operation method of claim 17, wherein the encrypting includes:

storing the encrypted tracking address as the tracking information in a mode setting circuit; and outputting the stored tracking information to the corresponding data bus in response to a mode register read command.

21. The operation method of claim 17, wherein the performing includes:

generating a target address by decrypting the row-hammer address using the encryption key; and performing the target refresh operation on at least one word line corresponding to the target address in response to a target refresh command.

22. The operation method of claim 17, further comprising generating the encryption key in response to a reset signal.

23. The operation method of claim 17, wherein the selected banks within the respective memory chips are in different locations within each of the memory chips.

* * * * *